United States Patent [19]

Palmer

[11] 4,186,017

[45] Jan. 29, 1980

[54] LIGHT-SENSITIVE COPYING COMPOSITION

[75] Inventor: Roland Palmer, Wiesbaden, Fed. Rep. of Germany

[73] Assignee: Hoechst Aktiengesellschaft, Fed. Rep. of Germany

[21] Appl. No.: 830,771

[22] Filed: Sep. 6, 1977

[30] Foreign Application Priority Data

Sep. 8, 1976 [LU] Luxembourg ................................ 75749

[51] Int. Cl.² .......................... G03C 1/52; G03C 1/68
[52] U.S. Cl. .................................... 430/162; 430/175; 430/172
[58] Field of Search ................... 96/91 R, 115 R, 75 R

[56] References Cited

U.S. PATENT DOCUMENTS

| | | | |
|---|---|---|---|
| 3,208,850 | 9/1965 | Daech | 96/91 R |
| 3,644,289 | 2/1972 | Sayigh et al. | 96/115 R |
| 3,655,625 | 4/1972 | Thomas | 96/115 R |
| 3,660,097 | 5/1972 | Mainthia | 96/91 D |
| 3,732,105 | 5/1973 | Klupfel | 96/115 R |
| 3,782,961 | 1/1974 | Takahashi | 96/115 R |
| 3,867,147 | 2/1975 | Tuescher | 96/33 |
| 3,957,512 | 5/1976 | Kleeberg | 96/115 R |

FOREIGN PATENT DOCUMENTS 2361931  6/1974  Fed. Rep. of Germany ........... 96/91 R

*Primary Examiner*—Mary F. Kelley
*Attorney, Agent, or Firm*—James E. Bryan

[57] ABSTRACT

This invention relates to a light-sensitive copying composition comprising a diazonium salt condensation product, a stabilizer, and a polyurethane prepolymer with free terminal isocyanate groups.

10 Claims, No Drawings

LIGHT-SENSITIVE COPYING COMPOSITION

This invention relates to a negative-working light-sensitive copying composition which may be used for the manufacture of high-quality planographic printing plates, proofing films, color separations, stencils, and etch resists.

Hitherto, two alternatives have been proposed for solving the technical problems involved in the provision of high-quality negative-working planographic printing plates based on diazonium compounds. One of these alternatives is concerned with the improvement of the properties of the light-sensitive diazo compound, whereas the other is aimed at the discovery of novel, sometimes tailor-made polymers which serve as a supporting frame in the copying composition and impart their physical properties thereto.

Whereas the known light-sensitive diazo compounds, such as those disclosed in German Offenlegungsschriften No. 2,024,242, and No. 2,024,244, have attained a high level of quality, the fine adjustment of the properties of copying compositions by means of polymers added thereto was found to be extremely difficult. There is a risk, for example, that the resistance to abrasion is insufficient for high demands, e.g. for cardboard printing, or that the image areas become blinded due to a loss of oleophilic properties, or that scumming occurs due to unsatisfactory development, or that the various components of the layer are not compatible with each other under changing conditions of storage.

It is known from U.S. Pat. No. 3,660,097, to combine linear polyurethane resins with negative-working or positive-working diazo compounds in light-sensitive copying compositions. Such copying compositions have the following drawbacks, however:

Difficulties in the preparation of the coating solutions due to the poor solubility of the layer components in the selected solvents; insufficient differentiation between the image areas and the non-image areas; poor developability and resulting undesirable scumming during printing; the so-called "aqueous" developers used contain large quantities of solvents and thus are more or less harmful ecologically, or cause annoying odors; and low practical light-sensitivity.

The light-sensitive coating composition known from German Offenlegungsschrift No. 2,361,931, contains branched polyurethane resins; it is expressly stated in this publication, however, that these compounds are produced by the complete reaction of the isocyanate groups contained in the starting materials, so that the resin does not contain any free, terminal isocyanate groups.

It is the object of the present invention to provide a light-sensitive copying composition based on diazo compounds which does not have the drawbacks just mentioned and which, above all, has good storage properties, a high practical light-sensitivity, enables good differentiation between image areas and non-image areas, results in a high resolution capacity, guarantees an easy and scum-free development, may be developed without environmental hazards, produces long runs and forms a durable, elastic coating after exposure which is free of pores and is resistant to mechanical abrasion and chemical attack.

According to the present invention, this object is achieved by a light-sensitive copying composition which comprises a diazonium salt condensation product and a polyurethane and in which the polyurethane is a branched polyurethane prepolymer containing free terminal isocyanate groups; the copying composition further contains a stabilizer.

The preferred copying composition according to the present invention contains, as the substantial components, a negative-working light-sensitive diazonium compound which dissolves readily in a solvent, a thermosetting polyurethane compound with free terminal isocyanate groups, a stabilizer of acid character, and possibly a non-drying alkyd resin.

Light-sensitive diazonium compounds which may be used are, above all, the diazo condensates produced from diazotized p-aminodiaryl-amines and carbonyl group-containing compounds, such as aldehydes, preferably formaldehyde, or aldehyde-donors, e.g. paraformaldehyde, which are described in various reprographic systems. These and other suitable compounds are disclosed in German Pat. No. 1,214,086, and in U.S. Pat. Nos. 2,922,715 and 2,946,683.

Diazonium compounds which are particularly suitable are condensation products of an aromatic diazonium compound according to German Offenlegungsschrift No. 2,024,244 comprising at least one unit each of the general types $$A(-D)_n \text{ and } B$$

which are linked by a bivalent intermediate member derived from a carbonyl compound capable of condensation, and wherein A is the radical of a compound containing at least two carbocyclic and/or heterocyclic aromatic rings and being capable of condensation in at least one position of its molecule with an active carbonyl compound in an acid medium, D is a diazonium salt group linked to an aromatic carbon atom of A, n is an integer from 1 to 10, and B is a radical of a compound free of diazonium groups and capable of condensation in at least one position of its molecule with an active carbonyl compound in an acid medium.

Virtually all compounds may be used as components $A(-D)_n$ and B which are capable of reaction, with condensation, with active carbonyl compounds in an acid medium and which are not decomposed by the conditions of the condensation reaction.

The condensation products are prepared either by a joint condensation of compounds corresponding to formula $A(-D)_n$ and compounds corresponding to formula B with an active carbonyl compound, preferably formaldehyde, or by condensation of $A(-D)_n$ with compounds $B_1$ corresponding to the general formula $$E(-CHR_a-OR_b)_m$$

wherein

E is a residue obtained by the splitting-off of m hydrogen atoms from a compound B of the above indicated meaning, $R_a$ is H, alkyl, preferably alkyl with 1 to 4 carbon atoms, or aryl, preferably phenyl, $R_b$ is H, alkyl or acyl, preferably with 1 to 4 carbon atoms, or phenyl, and m is an integer from 1 to 10.

Diazonium Compounds Corresponding to $A(-D)_n$

In addition to the aromatic iso- or heterocyclic group which carries the diazo group, the diazonium compounds to be used in accordance with the present invention contain in the radical A at least one further isocyclic and/or heterocyclic ring which contains at least one nuclear position capable of condensation.

An important group of diazonium compounds which are preferred as reaction partners are compounds of the following general formula:

$$(R_1-R_3-)_p R_2-N_2 X$$

wherein
- p is a positive integer from 1 to about 3, preferably 1,
- X is the anion of the diazonium compound, which also may be formed by an acid substituent of the molecule,
- $R_1$ is a substituted or unsubstituted isocyclic or heterocyclic aromatic residue which has at least one position capable of condensation, preferably a phenyl radical which may be substituted. Preferred substituents are, e.g., alkyl, alkoxy, alkylmercapto, aryloxy, arylmercapto, hydroxy, mercapto, amino, and anilino groups,
- $R_2$ is an aromatic ring of the benzene or naphthalene series which may carry further substituents, in addition to the diazonium group, and
- $R_3$ is a connecting member between members $R_1$ and $R_2$, the connecting member corresponding, e.g., to one of the following types, the ring $R_1$ always being imagined at the left-hand side and the group $R_2$ at the right-hand side, unless $R_3$ is symmetrical:

a simple homopolar bond, $-(CH_2)_q-NR_4-$ (wherein q is a whole number from 0 to 5, and $R_4$ is H, alkyl with 1 to 5 carbon atoms, aralkyl with 7 to 12 carbon atoms, or aryl with 6 to 12 carbon atoms), $-(CH_2)_q-NR_4-(CH_2)_r-NR_5-$ (wherein r is a whole number from 2 to 5 and $R_5$ is H or alkyl with 1 to 5 carbon atoms), $-O-(CH_2)_q-NR_4-(CH_2)_r-NR_5-$ (same definition)

$-O-(CH_2)_r-NR_4-$ $-S-(CH_2)_r-NR_4-$ $-O-R_6-O-$ (wherein $R_6$ is arylene with 6 to 12 carbon atoms $-O-$ $-S-$ $-CO-NR_4-$ $-SO_2-NR_4-$ $-S-(CH_2)_q-CO-NR_4-$ Exemplary of compounds of the formula $(R_1-R_3-)_p R_2-N_2 X$ are:

2,3',5-trimethoxy-diphenyl-4-diazoniumchloride
2,4',5-triethoxy-diphenyl-4-diazoniumchloride
4-[3-(3-methoxy-phenyl)-propylamino]-benzenediazoniumsulfate
4-[N-ethyl-N-(4-methoxy-benzyl)-amino]-benzenediazoniumchloride
4-[N-(naphthyl-(2)-methyl)-N-n-propyl-amino]-benzenediazoniumsulfate
4-[N-(3-phenoxy-propyl)-N-methyl-amino]-2,5-dimethoxy-benzenediazoniumtetrafluoroborate
4-[N-(3-phenyl-mercapto-propyl)-N-ethyl-amino]-2-chloro-5-methoxybenzenediazoniumchloride
4-[4-(3-methyl-phenoxy)-phenoxy]-2,5-dimethoxy-benzene-diazoniumsulfate,
4-(4-methoxy-phenylmercapto)-2,5-diethoxy-benzenediazoniumchloride
2,5-diethoxy-4-phenoxy-benzenediazoniumchloride
4-(3,5-dimethoxy-benzoylamino)-2,5-diethoxy-benzenediazoniumhexafluorophosphate
carbazole-3-diazoniumchloride
3-methoxy-diphenyleneoxide-2-diazoniumchloride
diphenylamine-4-diazoniumsulfate.

Mixed condensates particularly suitable for use in the reproduction layers of the invention are obtained by using diazo compounds of the general formula $$(R_1-R_3-)_p R_2-N_2 X$$

wherein
- p is an integer from 1 to 3, preferably 1,
- $R_1$ is a phenyl group either unsubstituted or substituted by one or more alkyl or alkoxy groups,
- $R_2$ is a benzene ring which, in addition to the diazonium group, may carry one or two identical or different substituents which may be halogen atoms, alkyl groups with 1 to 4 carbon atoms, or alkoxy groups with 1 to 5 carbon atoms, and
- $R_3$ is a homopolar bond or one of the members $-O-$, $-S-$, or $-NH-$.

A particularly important group of diazo compounds having structures according to the general formula $(R_1-R_3-)_p R_2-N_2X$ are the salts of the diphenylamine-4-diazonium ion and its substitution products.

Preferably employed substituents which may be linked to the phenyl nuclei of the diphenylamine-4-diazonium compounds are alkyl and alkoxy groups with 1 to 6, preferably 1 to 2, carbon atoms. Furthermore, the halogens and the following groups may be employed:

$-COOR$ (R is H, alkyl or aryl)

$-CONH_2$ $-CN$ $-COR$ (R is H, alkyl or aryl)

$-SO_2OR$ (R is H, alkyl, or aryl)

$-NHCOR$ (R is alkyl or aryl)

—NHR and NRR'

(R and R' are alkyl, aryl, or aralkyl).

Exemplary of substituents which may be linked to the phenyl nuclei of the diphenylamine diazonium group are methyl, propyl, isobutyl, trifluoromethyl, methoxy, difluoromethoxy, ethoxy, hydroxyethoxy, ethoxyethoxy, fluorine, chlorine, bromine, iodine, ethoxycarbonyl, phenoxycarbonyl, acetyl, methoxysulfonyl, ethoxysulfonyl, acetylamino, methylamino, ethylamino, dimethylamino, diethylamino, methylethylamino, phenylamino, benzylamino, methylbenzylamino, and ethylbenzylamino.

Suitable diphenylamine-4-diazonium salts are, for example, the diazonium salts derived from the following amines: 4-amino-diphenylamine, 4-amino-3-methoxy-diphenylamine, 4-amino-2-methoxy-diphenylamine, 4'-amino-2-methoxy-diphenylamine, 4'-amino-4-methoxydiphenylamine, 4-amino-3-methyl-diphenylamine, 4-amino-3-ethyldiphenylamine, 4'-amino-3-methyl-diphenylamine, 4'-amino-4-methyl-diphenylamine, 4-amino-3-ethoxy-diphenylamine, 4-amino-3-hexyloxy-diphenylamine, 4-amino-3-β-hydroxy-ethoxy-diphenylamine, 4'-amino-2-methoxy-5-methyl-diphenylamine, 4-amino-3-methoxy-6-methyl-diphenylamine, 4'-amino-3,3'-dimethyl-diphenylamine, 3'-chloro-4-amino-diphenylamine, 4'-amino-4-n-butoxy-diphenylamine, 4'-amino-3',4-dimethoxy-diphenylamine, 4-amino-diphenylamine-2-sulfonic acid, 4-amino-diphenylamine-2-carboxylic acid, 4-aminodiphenylamine-2'-carboxylic acid, and 4'-bromo-4-amino-diphenylamine.

Preferably employed are 4-amino-diphenylamine and 3-methyl-4-amino-diphenylamine, particularly preferably are the 3-alkoxy-4-aminodiphenylamines having 1 to 3 carbon atoms in the alkoxy group, especially the 3-methoxy-4-amino-diphenylamine.

Components B

Similarly, a plurality of compounds are suitable as components B in the preparation of the mixed condensates. An important class are the substituted or unsubstituted aromatic hydrocarbons and aromatic heterocyclic compounds.

Examples of unsubstituted aromatic isocyclic and heterocyclic compounds which may be used as components B are, e.g., benzene, naphthalene, anthracene, phenanthrene, pyrene, indene, fluorene, acenaphthene, thiophene, furan, benzofuran, diphenylene oxide, benzothiophene, acridine, carbazole, phenothiazine, and others which may be substituted by one of the following groups:

—$NR_7R_8$

—$N(R_8)_2$

—$OR_7$

—$OR_8$

—$R_8$

—$SR_7$

—$SR_8$ wherein $R_7$ may be H, —CO-alkyl, —CO-aryl, —CO-heteroyl, —CO-aralkyl, —$SO_2$-alkyl, —$SO_2$-aryl, —$SO_2$-aralkyl, —$SO_2$-heteroyl, —$CONH_2$, —$CSNH_2$, —CONH-alkyl, —CONH-aryl, —CO—O-alkyl, —CO—O-aryl, —CS—O-aryl, and —CS—O-alkyl, and $R_8$ may be H, an alkyl, aryl, or an aralkyl group.

The meanings of certain terms are as follows:

Alkyl: A branched or unbranched alkyl group with 1 to 10 carbon atoms which may be substituted, e.g. by -halogen, -alkoxy, —OH, —COOH, —$CONH_2$, —CN, —CO—$CH_3$, —$SO_3H$, or —$PO_3H_2$, or hydrogens in neighboring positions may be replaced by oxygen (epoxides) or removed (multiple bonds). The alkyl radical also may be interrupted, e.g. by —O—, —S—, —N(alkyl)—, —$SO_2$—, or —SO—.

Aryl: A mono- or polynuclear aromatic ring which, including alkyl, alkoxy, or aralkyl groups which may be linked thereto, contains from 6 to 20 carbon atoms. The aryl nucleus may carry additional substituents.

Aralkyl: A group containing 7 to 20 carbon atoms which is composed of alkyl and aryl radicals (corresponding to the above definition).

Alkoxy: O-alkyl group, the alkyl having the above meaning.

The alkyl, aryl, aralkyl, and alkoxy groups may be present one or more times, either alone or together.

According to the above, the compounds to be employed as components B or components $B_1$ derived therefrom belong to the following groups of substances, for example:

aromatic compounds (iso- and heterocyclic), unsubstituted
aromatic amines
phenols and thiophenols
phenol ethers and thiophenol ethers
aromatic compounds substituted by alkyl, aralkyl or aryl groups
urea, thiourea, carboxylic acid amides (aliphatic and aromatic),
and sulfonic acid amides (aliphatic and aromatic).

In order to limit the contribution of these substances to the molecular weight of B, the proportion of the four above-mentioned substituents in the structure of the molecule of compound B is limited, the primary aromatic iso- or heterocyclic ring or the condensed ring system being substituted only to such an extent that the aromatic compound is increased, in the case of substitution by alkyl groups: by not more than 10 carbon atoms,
by aryl groups: by not more than 20 carbon atoms,
by aralkyl groups: by not more than 20 carbon atoms, and
by alkoxy groups: by not more than 10 carbon atoms.

The total increase in C atoms by these four types of substituents should not exceed 30 C atoms with respect to the original aromatic nucleus.

Generally, components B are preferred which have a molecular weight of less than 500, preferably less than 250, amines being calculated as free amines, not in the salt form, and acid groups being calculated in the H-form. If the compounds are aromatic compounds, those compounds are preferred within these limits which contain not more than 4, preferably not more than 1 to 2, most advantageously 2, individual aromatic rings (fused to each other and/or connected with each other, preferably by homopolar bonds and/or intermediate members).

This means that the number of substituents with longer chains, i.e. those having a relatively large number of C atoms, which may be present at the same time, is smaller than the number of substituents with fewer C atoms. Generally, the short-chain alkyl and alkoxy groups (1 to 4 carbon atoms) and the smaller aromatic radicals in aryl and aralkyl groups (up to 12 carbon atoms) are preferred, because the corresponding compounds are more easily soluble in the condensation media and condensation thus can be performed more easily. For the same reason, substitution is limited as described above.

The condensable iso- or heterocyclic aromatic rings also may have substituents exerting a deactivating effect on the nuclei, e.g. $O_2N-$, $HOOC-$, $NC-$, $HO_3S$, and $H_2O_3P$ groups, provided these groups do not destroy the condensability of these rings. This means that such substituents may be particularly introduced if the ring as such is easily condensable or carries substituents having a strongly activating effect. Another possibility for introducing deactivating substituents without unduly reducing the condensability of the ring is to place the substituents in side chains, e.g. aliphatic side chains.

Substituents deactivating nuclear condensation also may be present in those cases in which the reactivity of the condensable nucleus is not necessary, because the nucleus has substituents at which condensation can take place. Such substituents are listed above and include, for example, the groups $-CO-NH_2$, $-SO_2NH_2$, and $-SO_2NH$-alkyl.

Of the classes of compounds indicated, from which the compounds B and $B_1$ derive, generally those are preferred which are unsaponifiable or only difficultly saponifiable under acid condensation conditions. The same applies to the diazo compounds $A(-D)_n$.

For this reason, those compounds B or $B_1$ of the series of aromatic iso- and heterocyclic compounds are advantageous which are either unsubstituted or carry alkyl, aralkyl, aryl, alkoxy, alkylmercapto, aryloxy, arylmercapto, OH, SO, and amino groups as substituents, if desired, in addition to unsaponifiable deactivating substituents, e.g. COOH. Of these compounds, those aromatic iso- and heterocyclic compounds are particularly preferred which are unsubstituted or contain, as substituents, one or more alkyl, aralkyl, aryl, alkoxy, alkylmercapto, arylmercapto, and aryloxy groups, particularly when condensates are desired which should not contain salt-forming groups other than the diazo group.

Exemplary of particularly suitable compounds B or $B_1$ are those which are derived from diphenyl ether, diphenyl sulfide, diphenyl methane, or diphenyl, and may contain one or two substituents selected from halogen atoms, alkyl groups, and alkoxy groups, but are preferably unsubstituted.

If these compounds are condensed with diphenylamine-4-diazonium salts which are unsubstituted or substituted by a lower alkyl group or a lower alkoxy group containing up to 3 carbon atoms, mixed condensates are obtained which can be readily precipitated and in good yields in the form of the salts of hydrochloric acid, hydrobromic acid, or of suitable sulfonic acids, especially when the component B or $B_1$ is employed in a proportion from 0.5 to 2 moles per mole of diazo compound.

The new condensation products of the invention generally contain 0.1 to 50 moles, preferably 0.1 to 20 moles, on the average, of units of component B per mole of units of component $A(-D)_n$. A particularly preferred range is from 0.2 to 2 moles of B per mole of $A(-D)_n$.

The mixed diazo condensates known from German Offenlegungsschrift No. 2,041,395, i.e. condensation products in which the anion of the diazonium salt is derived from an aliphatic monosulfonic acid with 1 to 6 carbon atoms, are particularly suitable for the copying composition according to the present invention.

The aliphatic monosulfonic acids forming the anion of the diazonium condensates used according to the invention normally have between 1 and 6 carbon atoms and may be substituted, if desired, by substitutents which are not too heavy, e.g. halogen atoms, viz. fluorine, chlorine, bromine or iodine, hydroxy groups, ether groups, and the like. Normally, not more than 1 substituent is present. The aliphatic chain may be straight, branched, or annular and may also contain double bonds. Methane sulfonates are particularly preferred.

The polyurethane prepolymers with free terminal isocyanate groups used according to the present invention normally are composed of three components, viz. a diisocyanate (I), a polyol with at least three free OH groups (II), and a diol (III).

Suitable diisocyanates (I) are: 2,4-toluylene diisocyanate, 2,6-toluylene diisocyanate, 4,4'-diphenylmethane diisocyanate, isophorondiisocyanate, 2,2,4-trimethyl-hexamethylene diisocyanate, hexamethylene diisocyanate, xylylene diisocyanate, 3,3'-bitoluylene-4,4'-diisocyanate, 3,3'-dimethyl-cyclohexane-4,4'-diisocyanate, 4,4'-phenyl-cyclohexylmethane-diisocyanate, 4,4'-dicyclohexylmethane-diisocyanate, phenylene-diisocyanate, 4,4'-diphenylether-diisocyanate, naphthalene-diisocynate, and lysine-diisocyanate.

2,4-Toluylene-diisocyanate, 2,6-toluylene-diisocyanate, 4,4'-diphenylmethane-diisocyanate, and 2,2,4-trimethyl-hexamethylene-diisocyanate are preferred.

The diisocyanates may be used either alone or in admixture with each other.

Suitable polyols (II) are, e.g.: 1,1,1-trimethylol propane, 1,1,1-trimethylol ethane, pentaerythritol, dipentaerythritol, and others.

Diols (III) which may be used are, among others, polyalkylene glycols of the following general formula $$HO(-CHR-CH_2-O)_n-H$$

wherein R stands for H or alkyl, preferably for H or methyl, and n is an integer from 1 to 10, or compounds of the following general formula $$HO-C_nH_{2n}-OH$$

wherein n is an integer from 2 to 10.

As a rule, the diisocyanates are reacted in known manner with a deficiency of polyol and diol, so that the proportion of free terminal isocyanate groups in the resulting polyurethane is in the range from 1 to 30 percent by weight, preferably from 5 to 25 percent by weight, and most advantageously between 7 and 20 percent by weight.

Depending upon the type and proportion of the polyol component, the polyurethane prepolymers thus prepared are more or less branched.

For stabilization of the copying composition, a compound with acid character must be added thereto. Suitable acids are mineral acids and also strong organic acids, phosphoric acid, sulfuric acid, perchloric acid, boric acid, and p-toluene sulfonic acid being preferred. Phosphoric acid is a particularly advantageous acid.

For fine adjustment of the layer properties, a non-drying synthetic alkyd resin with a branched, saturated fatty acid component (cf. Karsten "Lackrohstofftabellen", page 73 et seq.) is added to the copying composition, by which the impact strength of the polyurethane prepolymer is increased and longer runs become possible, if the copying composition is used as a printing image. At the same time, the resin exerts a plasticizing effect on the prepolymer.

Preferred alkyd resins are those which are obtained by polycondensation of phthalic acid anhydride, polyols, e.g. glycerol, pentaerythritol, 1,1,1-trimethylol propane, or 1,1,1-trimethylol ethane, and a branched monocarboxylic acid, e.g. i-nonane acid, i-octane acid, etc.

Further, known plasticizers, adhesion promoters, dyestuffs, pigments, color couplers, and/or UV absorbers may be added to the copying compositions of the invention.

The type and quantity of such additives depend on the purpose for which the copying composition according to the invention is destined. In any case, however, care must be taken that the substances added do not absorb an excessive proportion of the actinic light required for cross-linking and thus reduce the practical light-sensitivity of the composition.

Suitable plasticizers are, e.g.: dibutyl phthalate, diisooctyladipate, nitro esters, alkyl and aryl phosphate esters, chlorinated paraffins, and glycols or aliphatic polyols.

If it is desired to ensure good storability at relative high atmospheric moisture, water-insoluble plasticizers are preferred.

Adhesion promoters are added in those cases where the light-sensitive copying compositions according to the invention are to be exposed to particular stress, e.g. when they are to be used as photoresist materials. Suitable adhesion promoters are, e.g., monomeric or polymeric organic silanes, nitrogen-containing heterocyclic compounds, such as those disclosed in U.S. Pat. Nos. 3,645,722, 3,622,234, and 3,827,908, heterocyclic mercaptan compounds according to German Offenlegungsschrift No. 2,028,733, mercapto alkanoic acid anilides according to German Offenlegungsschrift No. 2,448,821, and mercapto alkanoic acid esters according to German Offenlegungsschrift No. 2,448,750.

Further, the light-sensitive copying compositions according to the invention may contain dyestuffs and/or pigments, which may serve to increase the contrast and also to harden the layer. Suitable dyestuffs are mentioned, e.g., in U.S. Pat. Nos. 3,218,167, and 3,884,693.

Rhodamine 6 GND extra (C.I. 45160), Crystal Violet (C.I. 42555), and a blue dyestuff obtained by condensation of 2,4-dinitro-6-chlorobenzene diazonium salt with 2-methoxy-5-acetyl-amino-N-cyanoethyl-N-hydroxy ethyl aniline, are particularly suitable.

Metanil Yellow (C.I. 13065) and Methyl Orange (C.I. 13025) may be used to increase the image contrast after development.

Further, the copying compositions according to the invention may contain UV-absorbers which serve as anti-halation filters. Suitable, non-coloring substances are described, e.g., in German Offenlegungsschrift No. 2,243,182.

Within the scope of the present invention, the following proportions by weight of the most important components of the light-sensitive composition are preferred, the percentages stated being by weight and based upon the total solids content, i.e. the total copying composition.

Polyurethane prepolymer: 30 to 80 percent, with a residual isocyanate content of from 1 to 30 percent, preferably from 5 to 25 percent, most advantageously between 7 and 20 percent.

Alkyd resin: 1 to 80 percent, preferably 2 to 50 percent.

Negative-working diazo compound: 20 to 70 percent.

Stabilizer: 1 to 10 percent.

Dyestuff or pigment: 0.5 to 5 percent.

Contrast promoter (dyestuff): 0.1 to 1 percent.

Homogeneous, aqueous acid solutions with pH of not more than 3, to which up to 4 percent of benzyl alcohol are added, are used as developers. The developer further contains neutral sodium and/or magnesium salts and wetting agents. The salt proportion should not exceed 3 percent.

For commercial purposes, the light-sensitive copying compositions according to the present invention may be marketed in the form of a solution or dispersion, e.g. as a so-called resist, which is applied by the customer to an individual support, as is customary, e.g., for chemical milling, for the production of printed circuits or stencils, of name plates, screen printing forms and the like, and is then dried, exposed, and imagewise developed. In this case, the components of the light-sensitive copying composition are dissolved in a suitable solvent. Suitable solvents are alcohols, ketones, esters, ethers and the like. The partial ethers of glycols or of keto-alcohols were found to be of particular advantage.

Alternatively, the light-sensitive copying composition according to the invention may be marketed in the form of a solid light-sensitive layer on a support, which is used for the preparation of printing forms, relief images, etch resists, stencils, mats, screen printing forms, individual copies, and the like. A particularly important application is their use as storable, pre-sensitized printing plates for planographic printing.

The base material is coated with the copying composition from appropriate organic solvents or solvent mixtures, by casting, spraying, or immersion.

Suitable base materials are, e.g., plates of magnesium, zinc, copper, mechanically, chemically, and electrochemically roughened aluminum, anodized aluminum, or steel, but also polyester or acetate films, Perlon gauze etc., and the surfaces of these materials may be subjected to a pretreatment, if necessary. The base material may serve as the final support, or it may be an intermediate support from which the light-sensitive copying composition may be transferred, by lamination, onto the material to be processed.

The recording material produced from the copying compositions according to the invention may be used, on the one hand, for the production of images on suitable supports or receiving sheets, and, on the other hand, for the preparation of reliefs which may be used as printing forms, screens, resists, and the like. Moreover, it is possible to use the light-sensitive copying compositions according to the invention for the preparation of UV-hardening printing inks or of UV-hardening lacquers which may be used for surface protection.

Most advantageously, the copying compositions according to the invention are used for the preparation of planographic printing forms, aluminum, especially anodized aluminum, being preferred as the base material.

The printing forms, screens, resists, and the like are prepared in the customary manner from the appropriate recording materials, e.g. after exposure under a suitable original, the non-image areas of the layer, which have retained their solubility, are removed by treatment with suitable developers, e.g. aqueous acid solutions.

By using the copying composition according to the present invention, a disadvantage of U.S. Pat. No. 3,660,097, is overcome, viz. that polyurethane prepolymers containing free terminal isocyanate groups are not storable and thus are unsuitable for the preparation of copying compositions.

In German Offenlegungsschrift No. 2,361,931, it is expressly stated that the polyurethanes to be used must be prepared by a complete reaction of the isocyanate groups contained in the starting materials.

Thus, it was the more surprising that copying compositions of the type proposed by the present invention, which contain free isocyanate groups, can be stored under extremely adverse conditions and, in addition thereto, have the following advantages:

They are distinguished by a high practical light-sensitivity, good differentiation between image areas and non-image areas, high resolution, easy, scum-free development involving no environmental hazards, long printing runs, and good compatibility of the components of the layer in the solvents selected for coating, e.g. ethylene glycol monomethyl ether, ethylene glycol monoethyl ether, diacetone alcohol, and mixtures of these solvents with butyl acetate, ethylene glycol methyl ether acetate, and methyl isobutyl ketone.

The invention will be further illustrated by the following examples. In these examples, the relation between parts by weight and parts by volume corresponds to that between grams and milliliters. Percentages and proportions are by weight unless otherwise stated.

EXAMPLE 1

A coating solution is prepared from
- 31.0 p.b.w. of a branched polyurethane prepolymer containing 7.0 percent of terminal free NCO groups and obtained by the reaction of about 8 moles of 2,4-toluylene diisocyanate with 1 mole of butane diol-(1,4), 1 mole of polypropylene glycol (MG 1000), and 2 moles of 1,1,1-trimethylol-propane,
- 20.2 p.b.w. of an alkyd resin obtained by polycondensation of 40 p.b.w. of phthalic acid anhydride, 10 p.b.w. of glycerol, 20 p.b.w. of pentaerythritol, and 44 p.b.w. of a branched, saturated monocarboxylic acid, with azeotropic distillation of the water produced,
- 31.2 p.b.w. of a tanning diazo, e.g. that obtained from paraformaldehyde and diphenyl-amine-4-diazoniumchloride or 3-methoxy-diphenylamine-4-diazoniumchloride with the addition of 85% phosphoric acid (see German Auslegeschrift No. 1,214,086, Examples 1 and 6),
- 3.2 p.b.w. of a red dyestuff of the following structure

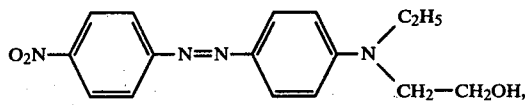

- 0.8 p.b.w. of Metanil Yellow (C.I. 13065), and
- 1800.0 p.b.w. of ethylene glycol monomethyl ether.

The resulting light-sensitive solution was coated as a layer weighing 1.1 g/m$^2$ onto an anodized aluminum support which had been pretreated as described in Example 7 of German Pat. No. 1,160,733. For this purpose, the anodized aluminum plate is immersed at about 70° to 90° C. in a 0.1 percent by weight solution of polyvinyl phosphonic acid, rinsed with water, dried, and finally coated with the light-sensitive solution.

For the preparation of a lithographic printing plate, the following procedure is used:

The copying layer is exposed under a negative original, e.g. for 65 seconds to a metal halide lamp of Messrs. Brilliant, Type H-KOPS, 5 kW output, at a distance of 130 cm. By means of a plush pad, the exposed layer is treated with a developer solution to remove the non-image areas, then rinsed with water, and squeegeed.

Upon determining the quality of the developed sample, it was found that step 5 of a step wedge is still fully blackened. The step wedge used is a silver halide film continuous tone step wedge with a density range from 0.05 to 3.05 and density increments of 0.15.

If a wet-brushed and pretreated aluminum support is whirler-coated with this composition, a layer of the same thickness requires an exposure time of 60 seconds for step 5 of the step wedge to be fully blackened.

A developer of the following composition may be used, and the same developer also may be used in the following examples:
- 25.0 p.b. vol. of completely desalted water,
- 0.75 p.b.w. of a wetting agent of the type of modified ammonium alkyl sulfate ("Sandopan FL"),
- 0.25 p.b.w. of 85% phosphoric acid,
- 0.40 p.b.w. of tartaric acid,
- 0.75 p.b.w. of benzyl alcohol, and
- 0.50 p.b.w. of Na$_2$SO$_4$·10H$_2$O.

EXAMPLE 2

A coating solution is prepared from
- 31.2 p.b.w. of the polyurethane prepolymer described in Example 1,
- 31.2 p.b.w. of a mixed diazo condensate produced as follows: 32.3 p.b.w. of 3-methoxy-diphenylamine-4-diazonium sulfate are dissolved in 170 p.b.w. of 85% phosphoric acid, 25.8 p.b.w. of 4,4'-bis-methoxy-diphenylether are dropwise added, and the mass is condensed for 5 hours at 40° C. After diluting with 250 p.b.w. of water, the chloride of the condensation product is precipitated by adding 220 p.b.v. of semi-concentrated hydrochloric acid. The chloride of the condensate is again dissolved in water and, after adding the sodium salt of mesitylene sulfonic acid, the mesitylene sulfonate of the diazo compound is obtained in the form of a sparingly soluble precipitate.
- 4.0 p.b.w. of one of the acids mentioned below, in ethylene glycol monomethyl ether.

Suitable acids are 85% phosphoric acid, 96% sulfuric acid, concentrated perchloric acid, boric acid, and p-toluene sulfonic acid.

The solutions thus produced are applied to an anodized aluminum support pretreated with polyvinyl phosphonic acid as in Example 1, so that dry layers weighing 1.0 g/m$^2$ each are produced.

Further processing is as described in Example 1.

The resulting printing forms are used for printing at least 50,000 copies on a Heidelberg offset printing machine, type KOR.

EXAMPLE 3

The following components 29.0 p.b.w. of the polyurethane prepolymer used in Example 1, 29.0 p.b.w. of an alkyd resin obtained by the polycondensation of 40 p.b.w. of phthalic acid anhydride, 30 p.b.w. of a mixture of glycerol and pentaerythritol, and 38 p.b.w. of a branched saturated monocarboxylic acid, with azeotropic distillation of the water produced, 30.0 p.b.w. of the mixed diazo condensate used in Example 2, 4.0 p.b.w. of 85% phosphoric acid, 3.0 p.b.w. of a blue dyestuff produced by condensation of 2,4-dinitro-6-chloro-benzene-diazonium salt with 2-methoxy-5-acetylamino-N-cyanoethyl-4-hydroxyethylaniline, and 1.0 p.b.w. of Metanil Yellow (C.I. 13065), are dissolved in ethylene glycol monomethyl ether and the solution is filtered.

The solution thus prepared is designated as "Solution a". An aluminum support which had been mechanically roughened by wet-brushing and whose surface had been pretreated with polyvinyl phosphonic acid as described in Example 1 is coated with "Solution a" above and the solvent is then removed by drying.

The resulting copying layer is exposed and developed as described in Example 1.

Complete development takes 90 seconds.

A sample of the same material which had been placed in a conditioning cabinet, at a temperature of 42° C. and an atmospheric moisture of 62%, may be satisfactorily developed within 90 seconds even after a residence time in the conditioning cabinet of 182 days.

In a comparison test, a coating solution "b" is prepared which contains the same components as "Solution a" with the exception of the phosphoric acid component.

The above described support is coated with "Solution b" and the resulting copying layer is processed as in Example 1.

When processing "Sample b", it is observed that only a freshly prepared sample can be satisfactorily developed within 90 seconds.

Even after a storage of only one day at room temperature (25° C.), it is no longer possible to develop the unstabilized copying layer without scumming.

Ageing of the copying layer increases as time progresses. After 7 days, it is no longer possible to produce a differentiation between the image areas and the non-image areas, even if the developing time is prolonged to 5 times its original length.

EXAMPLE 4

A solution with a solids content of 7.5 percent is produced from the following components:

31.0 p.b.w. of the polyurethane prepolymer used in Example 1, 62.4 p.b.w. of the mixed diazo condensate described in Example 2, 3.0 p.b.w. of 85% phosphoric acid, and 3.0 p.b.w of Crystal Violet and ethyleneglycol monomethyl ether.

The solution is applied, as a layer weighing 1.5 g/m$^2$, to an eloxated aluminum support (weight of the oxide layer: 2 g/m$^2$), pretreated with polyvinyl phosphonic acid as described in Example 1.

By exposing the material for 80 seconds under a negative original, using the metal halide lamp described in Example 1 at a distance of 130 cm, and developing it for 90 seconds with the developer of Example 1, flawless copies are obtained. With an exposure time of 80 seconds, the step wedge is fully blackened up to step 5.

After development, the printing plate shows excellent contrast, so that even the finest film edges are clearly discernible.

A plate processed in this manner yields 110,000 copies on a printing machine.

EXAMPLE 5

A light-sensitive copying composition is prepared from the following components:

61.0 p.b.w. of a branched polyurethane prepolymer which contains 16 percent of terminal free NCO groups and is obtained by reacting 4,4'-diphenylmethane-diisocyanate with a mixture of butane diol-(1,4), polypropylene glycol, and 1,1,1-trimethylol propane, 31.2 p.b.w. of the mixed diazo condensate described in Example 2, 4.0 p.b.w. of 85% phosphoric acid, 4.0 p.b.w. of the red dyestuff used in Example 1, and 1.0 p.b.w. of Methyl Orange (C.I. 13025), dissolved in ethyleneglycol monomethyl ether.

If the layer has a thickness corresponding to a weight of 1.4 g/m$^2$ and the above mentioned red dyestuff is used, an exposure time of 50 sec. (metal halide lamp) at a distance of 130 cm is required to cause step 5 of the copy of the step wedge to be fully blackened.

After development, the plate shows a brilliant, deeply violet contrast.

EXAMPLE 6

The following components 60.0 p.b.w. of a polyurethane prepolymer with an isocyanate content of about 20 percent, based on the molecular weight of the prepolymer, and corresponding to the following formula

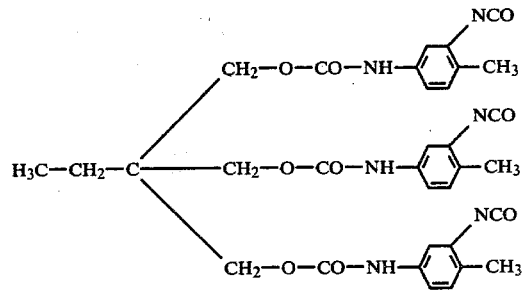

30.0 p.b.w. of the mixed condensate used in Example 2, 7.5 p.b.w. of Rhodamine 6 GDN extra (C.I. 45160), and 3.3 p.b.w. of 85% phosphoric acid were applied, as a 5 percent solution in ethyleneglycol monomethyl ether, onto an anodized support, so that the resulting layer weighed 1.0 g/m². After 30 seconds' exposure to a metal halide lamp at a distance of 130 cm and development with the developer used in Example 1, a run of 70,000 copies could be printed.

The layer shows an exceptionally steep gradation corresponding to only one half tone step of the step wedge.

EXAMPLE 7

33.0 p.b.w. of the polyurethane prepolymer described in Example 1,
25.0 p.b.w. of the alkyd resin used in Example 3,
3.4 p.b.w. of polyvinyl formal,
35.2 p.b.w. of the mixed diazo condensate described in Example 2,
3.0 p.b.w. of 85% phosphoric acid,
3.0 p.b.w. of Rhodamine 6 GDN extra (C.I. 45160), and
0.8 p.b.w. of Metanil Yellow (C.I. 13065)
are dissolved in
2000.0 p.b.w. of ethyleneglycol monomethyl ether.

A layer weighing 1.0 g/m² is applied to wet-brushed aluminum which had been treated with polyvinyl phosphonic acid as described in Example 1. After 45 seconds' exposure under a negative original to the light of a metal halide lamp at a distance of 130 cm, the layer is developed for 45 seconds with the developer used in Example 1. Excellent copies are produced which yield 35,000 prints in a printing machine.

Even after three months' storage, the properties of the copying layer are unchanged.

EXAMPLE 8

A 5% solution in ethyleneglycol monomethyl ether is prepared from the following components:
30.0 p.b.w. of the polyurethane prepolymer described in Example 1,
28.0 p.b.w. of the alkyd resin described in Example 3,
30.0 p.b.w. of the mixed diazo condensate described in Example 2,
4.0 p.b.w. of 85% phosphoric acid,
3.0 p.b.w. of a pigment dispersion composed of 10 percent by weight of "Hostaperm Blue B G" (C.I. 74160) and 10 percent by weight of polyvinyl formal and 80 percent by weight of ethylene glycol methyl ether acetate, and
1.0 p.b.w. of Metanil Yellow (C.I. 13065),
and the solution is whirler-coated onto an eloxated aluminum support which had been pretreated with polyvinyl phosphonic acid as described in Example 1, to produce a layer weighing 1.2 g/m².

After 30 seconds' exposure to a metal halide lamp from a distance of 130 cm, the layer may be developed within 90 seconds with the developer mentioned in Example 1.

The copies thus produced have a good contrast which does not noticeably diminish even after five times the developing time.

Printing runs of 130,000 copies were printed on a printing machine. The properties of the copying layer are still good after 50 days' storage at a temperature of 42° C. and a humidity of 62%.

EXAMPLE 9

61.0 p.b.w. of the polyurethane prepolymer described in Example 1,
31.2 p.b.w. of the condensation product of an aromatic diazonium compound used in Example 2,
4.0 p.b.w. of 85% phosphoric acid,
4.0 p.b.w. of Rhodamine 6 GDN extra (C.I. 45160), and
1.0 p.b.w. of Metanil Yellow (C.I. 13065)
are dissolved in ethyleneglycol monomethyl ether.

This solution is then coated onto a support of electrochemically roughened and anodized aluminum with an oxide layer of 3 g/m², which had been pretreated with polyvinyl phosphonic acid as described in Example 1.

The dry weight of the layer is between 1.0 and 1.4 g/m². For the preparation of a lithographic printing plate, the following procedure is employed:

The negative-working reproduction layer is exposed for 40 seconds under a negative original to the light of a metal halide lamp at a distance of 130 cm and is then treated with the developer used in Example 1.

From the resulting printing form, a run of more than 100,000 flawless prints may be printed on a printing machine.

EXAMPLE 10

A coating solution is prepared from
30.0 p.b.w. of the polyurethane prepolymer described in Example 1,
60.0 p.b.w. of the mixed diazo condensate described in Example 2,
4.0 p.b.w. of 85% phosphoric acid, and
2.0 p.b.w. of the red dyestuff used in Example 1, dissolved in ethylene glycol monomethyl ether, and the resulting solution is applied to a 50 μm thick, biaxially stretched polyethylene terephthalate film in such a manner that the applied layer weighs 3.5 g/m².

The coated film is exposed for 3 minutes under a negative original, using an exposure device (8 kW Xenokop apparatus of Messrs. Klimsch & Co.) at a distance of 75 cm, and is then developed for 90 seconds with the developer used in Example 1. An excellent copy is produced.

If four solutions prepared from the polyurethane prepolymer mentioned in Example 1, a mixed diazo condensate, and phosphoric acid are dyed in the four primary colors yellow, red, blue, and black, and the four solutions are then used for coating polyester films, color proofing foils are obtained which may be used for a negative-working color proofing system according to the overlay principle.

For this purpose, the individual color proofing films are exposed under the corresponding silver halide color separations, developed with the developer of Example 1, and the resulting color images are carefully dried. If the resulting four images are superimposed in register with each other, a four-colored image corresponding to the original is produced.

EXAMPLE 11

A coating solution is prepared from the following components:
28.8 p.b.w. of the polyurethane prepolymer described in Example 1,
25.0 p.b.w. of the alkyd resin described in Example 3,
3.0 p.b.w. of polyvinyl formal, 30.0 p.b.w. of the mixed diazo condensate described in Example 2, 4.0 p.b.w. of 85% phosphoric acid, in 92.0 p.b.w. of ethyleneglycol monomethyl ether, and 46.0 p.b.w. of ethyleneglycol methyl ether acetate.

The resulting solution is applied as a layer weighing 1.4 g/m² to a polyethylene terephthalate film which had been hydrophilized by a silica treatment according to German Auslegeschrift No. 1,228,414. For this hydrophilizing treatment, the surface of the film is treated with a mixture comprising (1) an aqueous solution of dichloro acetic acid or trichloro acetic acid or 2,2,3-trichloro propionic acid, (2) very finely divided pyrogenic silica obtained in the gaseous phase, and (3) a conventional wetting agent which is resistant to the action of acids and heat, and is then dried. After exposure (45 seconds at a distance of 75 cm, using a Xenokop apparatus of 8 kW) and development as in Example 1, flawless copies result. Treatment with an image intensifier may be combined with the application of a preserving solution.

EXAMPLE 12

30.0 p.b.w. of the polyurethane prepolymer described in Example 1, 60.0 p.b.w. of the mixed diazo condensate described in Example 2, 4.0 p.b.w. of 85% phosphoric acid, and 4.0 p.b.w. of the red dyestuff used in Example 1, are dissolved in 900 p.b.w. of ethyleneglycol monomethyl ether and applied, as a layer weighing 3 g/m², to a zinc plate cleaned by means of a 0.3 percent nitric acid solution. The plate is then exposed for 3 minutes, at a distance of 75 cm, to an 8 kW xenon lamp under a negative original, developed with the developer used in Example 1, and finally etched with 7.5% nitric acid. The hardened image areas form an excellent etch resist.

EXAMPLE 13

34.5 p.b.w. of the polyurethane prepolymer described in Example 1, 11.5 p.b.w. of a mixed diazo condensate prepared from a solution of 32.3 g of 3-methoxy-diphenylamine-4-diazonium sulfate in 100 ml of 86% phosphoric acid to which 25.8 g of 4,4'-bis-methoxymethyldiphenyl ether are dropwise added. After 17 hours' condensation at 40° C., the methane sulfonate was separated, purified and dried. This method of preparation is described in Example 4 of German Offenlegungsschrift No. 2,041,395;

2.4 p.b.w. of 85% phosphoric acid, 1.6 p.b.w. of Crystal Violet (C.I. 42555), in 900.0 p.b.w. of ethyleneglycol monomethyl ether.

The solution is applied, as a layer weighing 1.0 g/m², to an anodized aluminum support corresponding to the one used in Example 1. The copying layer is exposed for 25 seconds under a negative original to the metal halide lamp described in Example 1 (distance: 130 cm) and then developed with the developer used in Example 1.

The plate thus obtained shows good contrast and is ready for printing.

It will be obvious to those skilled in the art that many modifications may be made within the scope of the present invention without departing from the spirit thereof, and the invention includes all such modifications.

What is claimed is:

1. A negative-working light-sensitive copying composition comprising a light-sensitive diazonium salt condensation product, an acid stabilizer, and a polyurethane prepolymer having from about 1 to 30 percent by weight of free terminal isocyanate groups.

2. A copying composition according to claim 1 in which the acid is selected from the group consisting of phosphoric acid, sulfuric acid, perchloric acid, boric acid, and p-toluene sulfonic acid.

3. A copying composition according to claim 1 in which the diazonium salt condensation product is a reaction product of a diarylamine-4-diazonium salt and formaldehyde.

4. A copying composition according to claim 1 in which the diazonium salt condensation product is a mixed condensate which contains at least one unit each of the general types $$A(-D)_n \quad \text{and} \quad B$$

which are linked by a bivalent intermediate member derived from a carbonyl compound capable of condensation, and wherein A is the radical of a compound containing at least two carbocyclic and/or heterocyclic aromatic rings and being capable of condensation in at least one position of its molecule with an active carbonyl compound in an acid medium, D is a diazonium salt group linked to an aromatic carbon atom of A, n is an integer from 1 to 10, and B is a radical of a compound free of diazonium groups and being capable of condensation in at least one position of its molecule with an active carbonyl compound in an acid medium.

5. A copying composition according to claim 4 in which the anion of the diazonium salt condensation product is the anion of an aliphatic monosulfonic acid with 1 to 6 carbon atoms.

6. A copying composition according to claim 1 which additionally contains a non-drying alkyd resin.

7. A copying composition according to claim 1 in which the polyurethane is present in the copying composition in a quantity between 30 and 80 percent by weight.

8. A copying composition according to claim 1 in which the diazo compound is present in the copying composition in a quantity between 20 and 70 percent by weight.

9. A copying composition according to claim 1 in the form of a light-sensitive layer on a support.

10. A copying composition according to claim 9 in which the support is aluminum.

* * * * *